(12) United States Patent
Grodzki

(10) Patent No.: US 11,555,876 B2
(45) Date of Patent: Jan. 17, 2023

(54) QUANTITATIVE MAGNETIC RESONANCE IMAGING TECHNIQUES

(71) Applicant: Siemens Healthcare GmbH, Erlangen (DE)

(72) Inventor: David Grodzki, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 303 days.

(21) Appl. No.: 16/713,141

(22) Filed: Dec. 13, 2019

(65) Prior Publication Data

US 2020/0191893 A1 Jun. 18, 2020

(30) Foreign Application Priority Data

Dec. 13, 2018 (DE) .......................... 102018221695.9

(51) Int. Cl.
*G01R 33/54* (2006.01)
*G01R 33/3415* (2006.01)
(Continued)

(52) U.S. Cl.
CPC ......... *G01R 33/54* (2013.01); *G01R 33/3415* (2013.01); *G01R 33/385* (2013.01);
(Continued)

(58) Field of Classification Search
CPC .. G01R 33/54; G01R 33/3415; G01R 33/385; G01R 33/5608; G01R 33/561;
(Continued)

(56) References Cited

U.S. PATENT DOCUMENTS

2015/0346301 A1* 12/2015 Cauley ............... G01R 33/4828
324/309
2016/0033604 A1* 2/2016 Grodzki ............. G01R 33/5608
324/309
(Continued)

FOREIGN PATENT DOCUMENTS

DE 102014217284 A1 3/2016
EP 3467531 A1 4/2019

OTHER PUBLICATIONS

McGivney, Debra et.al; "SVD Compression for Magnetic Resonance Fingerprinting in the Time Domain"; IEEE Transactions on Medical Imaging; vol. 33, No. 12; Dec. 2014.
(Continued)

*Primary Examiner* — Rishi R Patel
(74) *Attorney, Agent, or Firm* — Banner & Witcoff Ltd.

(57) ABSTRACT

The present disclosure relates to quantitative magnetic resonance imaging. A time series of magnetic resonance images of an examination region are assigned to different time points following an excitation is acquired by means of a magnetic resonance device, a signal evolution varying with respect to time is determined from the magnetic resonance images for each pixel from the magnetic resonance data of all of the magnetic resonance images and, by comparison of the signal evolution with comparison evolutions stored in a database, at least one quantitative result value on which the comparison evolution exhibiting the greatest agreement is based is assigned to a respective pixel.

15 Claims, 4 Drawing Sheets

(51) Int. Cl.
*G01R 33/385* (2006.01)
*G06T 7/00* (2017.01)
*G01R 33/561* (2006.01)
*G01R 33/56* (2006.01)

(52) U.S. Cl.
CPC ....... *G01R 33/561* (2013.01); *G01R 33/5608* (2013.01); *G06T 7/0014* (2013.01); *G06T 2207/10016* (2013.01); *G06T 2207/10088* (2013.01)

(58) Field of Classification Search
CPC .. G01R 33/5659; G01R 33/422; G01R 33/50; G06T 7/0014; G06T 2207/10016; G06T 2207/10088
See application file for complete search history.

(56) References Cited

U.S. PATENT DOCUMENTS

| | | | |
|---|---|---|---|
| 2016/0061922 A1 | 3/2016 | Grodzki et al. | |
| 2016/0069975 A1* | 3/2016 | Rothberg | G01R 33/34007 324/322 |
| 2016/0139227 A1* | 5/2016 | Grodzki | G01R 33/5608 324/309 |
| 2016/0349339 A1* | 12/2016 | Brady-Kalnay | G01R 33/5614 |
| 2019/0154779 A1* | 5/2019 | Yaesoubi | G01R 33/5608 |

OTHER PUBLICATIONS

German Office Action dated Oct. 25, 2019, for Application No. 10 2018 221 695.9.

* cited by examiner

QUANTITATIVE MAGNETIC RESONANCE IMAGING TECHNIQUES

CROSS-REFERENCE TO RELATED APPLICATIONS

The present application claims the benefit of the filing date of German patent application no. 102018221695.9, filed on Dec. 13, 2018, the contents of which are incorporated herein by reference in their entirety.

TECHNICAL FIELD

The present disclosure relates to the field of magnetic resonance imaging and, in particular, to quantitative magnetic resonance imaging techniques.

BACKGROUND

Magnetic resonance imaging constitutes an important tool in particular in medicine, in diagnostics for example. In this environment it was common practice until now in most cases to record qualitatively weighted magnetic resonance images, for example T1-weighted, T2-weighted and/or proton-density-weighted images. However, a quantitative magnetic resonance imaging technique has also been proposed to ultimately obtain a result in the form of a quantitative measurement map in which, for example, relaxation times or other material parameters are plotted pixel by pixel.

A well-known quantitative magnetic resonance imaging method is the technique known as magnetic resonance fingerprinting (MRF), by means of which multiple physical values, for example the relaxation times T1 and T2, can be measured simultaneously pixel by pixel in one measurement. In this process, a large number of magnetic resonance images are acquired sequentially as a time series preferably using a one-shot imaging technique, measurement parameters such as the repetition time, flip angle and the like varying over the course thereof such that other signal evolutions are produced across the magnetic resonance images as a function of the physical properties in the regions measured by the pixels. These signal evolutions, which are also referred to as fingerprints, can be assigned to an n-tuple of physical result values, for example material parameters, through matching with comparison evolutions in databases.

SUMMARY

The present disclosure relates to a quantitative magnetic resonance imaging method, wherein a time series of magnetic resonance images of an examination region that are assigned to different time points following an excitation is acquired by means of a magnetic resonance device, from which images a signal evolution varying with respect to time is determined for each pixel from the magnetic resonance data of all of the magnetic resonance images and, by comparison of the signal evolution with comparison evolutions stored in a database, at least one quantitative result value on which the comparison evolution exhibiting the greatest agreement is based is assigned to a respective pixel. In addition, the invention relates to a magnetic resonance device, a computer program and an electronically readable data medium.

As noted herein, a hoped-for advantage of magnetic resonance fingerprinting is a certain robustness toward minor deviations or errors in the fingerprint, that is to say, the signal evolution. This robustness is used, for example, to compensate for undersampling artifacts of the individual magnetic resonance images, and is intended overall to culminate in magnetic resonance fingerprinting being insensitive toward minor movement in the examination region that is to be scanned.

As well as these technical advantages, magnetic resonance fingerprinting also provides a great advantage in terms of simplicity of operation, since ultimately only one start operator control element and one stop operator control element are required for the measurement. The sequence and type of the magnetic resonance images are then chosen automatically in accordance with the comparison evolutions present in the database. This makes the magnetic resonance fingerprinting method particularly attractive to users with less qualified staff, who are possibly looking for cost-effective solutions for whom magnetic resonance fingerprinting holds appeal.

A further current focus of research aimed at cost-effective solutions of the aforesaid type is the development of magnetic resonance systems in which the magnetic resonance device is not arranged in a shielded enclosure (RF cabin). If no RF-shielded cabin is required, savings can be made on installation and maintenance costs and resources, and the magnetic resonance device is made spatially more independent. The greatest problem here from the magnetic resonance perspective is to make the measurement as robust as possible with respect to external infiltrating sources of radiofrequency interference, which may otherwise be prevented by the presence of a shielded cabin. To that end, it has been proposed to make use of additional hardware, for example pick-up antennas arranged outside of the patient receiving zone, in order to measure such potential interference fields, though this results in a further increase in system cost and complexity.

In the attempt to combine these techniques, it should be noted that unpredictable interferences that may occur due to the absence of a shielded cabin (e.g. in the case of individual or multiple magnetic resonance images) can lead to barely detectable effects that nonetheless significantly alter the signal evolutions, whereas a lesser robustness of the magnetic resonance fingerprinting is given.

Since magnetic resonance fingerprinting frequently entails the acquisition of a large number of magnetic resonance images, i.e. an extremely complex comparison process is present involving comparison evolutions stored in a database (also often referred to as a predefined dictionary), it has been proposed, for example in an article by Debra F. McGivney et al., "SVD Compression for Magnetic Resonance Fingerprinting in the Time Domain," IEEE Transactions on Medical Imaging (Volume: 33, Issue: 12, December 2014), to apply a singular value decomposition both for the comparison evolutions and for the signal evolutions. In this way the pattern recognition algorithms that perform the comparison of the signal evolutions with the comparison evolutions are accelerated. However, evolution changes produced due to disturbances of an unknown kind are also mapped during a singular value decomposition, with the result that this method does not increase robustness in the event of radiofrequency interference.

The object underlying the present disclosure is therefore to disclose a variant of a magnetic resonance fingerprinting that is more robust to unpredictable radiofrequency interference.

In order to achieve this object, there are provided according to the present disclosure a method, a magnetic resonance device, a computer program, and an electronically readable data medium according to the independent claims and as discussed elsewhere herein. Advantageous embodiments are also described in further detail and will become apparent from the dependent claims.

In a method of the type cited in the introduction, it is provided according to the present disclosure that, in order to perform the comparison process, at least two examination evolutions are defined, one in particular of which corresponds to the full signal evolution, and at least one corresponds to a partial evolution not encompassing all time points, each examination evolution is compared with reference evolutions formed from the same time points of respective comparison evolutions in order to obtain a comparison result, and the comparison evolution exhibiting the greatest agreement is determined using all of the comparison results.

It should be noted that it may also lie within the scope of the present disclosure that, if no comparison evolution exhibiting the greatest agreement can be meaningfully assigned, i.e. determined, this circumstance, i.e. the non-determinability, is output. This will be explored in greater detail below.

The idea of the present disclosure is therefore to not only compare the entire signal evolution covering all time points (and hence magnetic resonance images), with the respective comparison evolutions, but to also consider time subwindows or other selections from the time points, e.g. to aim at a maximally large uniform distribution across all time points to increase the probability that, if a transient interference is present, examination evolutions are also analyzed in which said interference is specifically not included. In this case, significantly more than two examination evolutions are preferably considered (e.g. at least ten examination evolutions) since then, in the case of isolated interference effects during the acquisition of the magnetic resonance fingerprints in the magnetic resonance fingerprinting method described here, the probability increases that a greater number of examination evolutions are not affected, or not affected in a relevant manner, by interference effects, and consequently the procedure overall becomes more robust to such perturbations. This makes it possible in particular to use a magnetic resonance device that is not arranged in an RF-shielded cabin.

In other words, the present disclosure describes an approach by means of which the influence of nonpermanent radiofrequency interference on magnetic resonance fingerprinting measurements is to be reduced to the greatest extent possible without further hardware. This takes advantage of the fact that magnetic resonance fingerprinting can be robust toward interferences of said type when only a subset of signal points is "disrupted."

Initially, therefore, a time series of magnetic resonance images is acquired in a usual manner such that the magnetic resonance fingerprint is produced for each picture element of the magnetic resonance images, i.e. each pixel, as a signal evolution across all time points. The magnetic resonance fingerprints resulting in each case are then examined multiple times, e.g. at least twice, in a different selection to identify possible "outliers," i.e. measurement errors, caused by radiofrequency interference. The number of examined time points is in this case less, in at least one of the comparison evolutions, than the number of fingerprinting signal points used for conventional calculation techniques, since conventional calculation techniques typically match the entire signal evolution, i.e. all time points, with the database to be able to find the matching comparison evolution.

It should be noted at this point that it is preferred, though not absolutely necessary, to also choose the signal evolution (containing all time points) as one of the examination evolutions. Since, however, in the case of no or minor interference, the signal evolution produces the most reliable match, it is advantageous to make use of it as one of the examination evolutions. In that case, therefore, within the meaning of the disclosure, not only the entire magnetic resonance fingerprint, i.e. the signal evolution, is matched with the database, but in addition also at least one "subset," i.e. an examination evolution not covering all time points, is matched with the database.

In this case, a preferred embodiment of the present disclosure provides that multiple partial evolutions covering all time points overall are defined. For example, an allocation of time points to a plurality of examination evolutions can therefore take place in such a way that all time points are covered by at least one set of partial evolutions. Preferably, a uniform distribution is provided in this case so that for example the partial evolutions cover all equal-sized, different time ranges or time ranges overlapping to the same extent, or the like.

In practice, it can for example be provided that at least one of the at least one partial evolutions is defined by means of a window selecting a fixed (e.g. predetermined) number of sequential time points. In this way, partial evolutions of the examination evolutions therefore correspond to sections of the overall signal evolution. For example, a subset of the magnetic resonance signals at different points defined by a start time point and an end time point can be considered and matched with the database. If, for example, 250 magnetic resonance images are acquired, i.e. if a signal evolution consists of 250 time points with assigned magnetic resonance signals, it can be provided that the window selects 20 to 50 time points. A beneficial development of the present disclosure can also provide that multiple partial evolutions are defined by means of a shifting of the window, e.g. as a disjointed or time-shifted sequence of partial evolutions, e.g. in the manner of a moving window. When a moving window is used, it can be provided, to achieve a particularly good coverage, that the moving window is always shifted by one time point, though it is of course also possible, e.g. to reduce the computational overhead, to shift a moving window by a greater number of time points between different partial evolutions.

Another embodiment of the present disclosure, preferably used in addition to the use of a time point of the continuously selecting windows, provides that at least one of the at least one partial evolutions is defined by time points spaced apart by a specific (e.g. predetermined or fixed) and/or a random number, e.g. 4 to 10, of time points or by groups of sequential time points, e.g. comprising 2 to 8 time points. This means that partial evolutions can also be defined by time points or time point groups in a predefined or random spacing, i.e. for example for every second, fifth or generally x-th time point. Multiple sequential time points can also be selected here in each case, such that for example a partial evolution is formed in which five successive time points are selected, then five time points are skipped, and so forth.

In particular through formation of time evolutions both by use of continuous windows and by partial evolutions omitting measurement time points, it is possible to produce examination evolutions unaffected or less affected by radiofrequency interference or other unwanted, unpredictable disturbances in a variety of ways, with the result that a high level of robustness is achieved overall.

The examination evolutions are matched with the database by means of any suitable (e.g. known) comparison algorithms, such as pattern recognition algorithms, and the time points from the database may be used to match an examination evolution obviously corresponding to those of the examination evolution. Thus, for example, if the time point 78 from the overall signal evolution is considered, the time point 78 from the comparison evolutions of the database may also be used for the matching. For example, a correlation of the respective examination evolution with the corresponding reference evolution can be determined and, as comparison result, the reference evolutions (and consequently comparison evolutions from which they are derived) can be specified for which the highest correlation or generally highest agreement in respect of the examination evolution is present. In order to then merge all of the comparison results, there basically exists a plurality of possibilities, wherein it can be provided also for the determination of correlations that a correlation-weighted merging of the comparison results is performed.

According to an embodiment of the present disclosure, it can be provided in practice that, in order to determine the comparison evolution exhibiting the greatest agreement, in the case of consistent comparison results in terms of the best agreement, the corresponding comparison evolution indicated by the comparison results is determined as the comparison evolution exhibiting the greatest agreement, in the case of a percentage undershooting a first threshold value out of the greatest number of comparison results indicating the same comparison evolution as that exhibiting the best agreement of all of the comparison results, a non-determinability of a comparison evolution exhibiting the greatest agreement is output, and in the case of a percentage exceeding the first threshold value out of the greatest number of comparison results indicating the same comparison evolution as that exhibiting the best agreement of all of the comparison results, this most-indicated comparison evolution is determined as the comparison evolution exhibiting the greatest agreement.

Thus, if the same comparison results are determined for all examination evolutions, it can be assumed that the measurement of the magnetic resonance images proceeded without interference. No further measures are necessary and the determined comparison evolution, and consequently the determined n-tuple of quantitative magnetic resonance fingerprinting results (i.e. result values, such as material parameters), is used as the result of the fingerprint examination for this pixel.

However, in the event that the majority of examination evolutions yield different comparison results, for example only less than a threshold such as 25% of all examination evolutions deliver the same comparison result, it should be assumed that the measurement is subject to a permanent and/or frequent and/or extremely variable, severe interference, such that it is not possible to specify an unequivocal end result. The corresponding situation can be output. In such cases, a new measurement can be initiated, for example; if the effect occurs repeatedly, it can be assumed that the disturbances in the case of this magnetic resonance device are too severe, at least at the present time, so that for example the procurement of additional hardware, for example pick-up antennas as sensors for measuring interference fields, appears beneficial.

However, if a sufficiently large number of examination evolutions in the comparison yield the same comparison results in terms of the comparison evolution exhibiting the best agreement for this examination evolution, e.g. over a threshold such as 25% of all considered examination evolutions in the example, it should be assumed that the measurement was subject to interference at certain time points, as the result for the pixel, however, the comparison evolution that was determined for the greatest percentage of the comparison results, or the associated n-tuple of result values, such as material parameters, are nonetheless assumed as the end result.

In a development in this embodiment, it can be provided that in the case of a percentage exceeding the first threshold value out of the greatest number of comparison results indicating the same comparison evolution as that exhibiting the best agreement out of all comparison results, if a second, higher threshold value is undershot by the percentage, information alerting to a lower level of reliability is generated and output. A tolerance range can therefore be defined in which, although a presumably correct result can be determined for the n-tuple of result values for the pixel, due to interferences there nonetheless exists uncertainties about which a user can be informed accordingly. As an example, in an exemplary embodiment, it can be provided that if the first threshold value amounts to 25, 50% is chosen as the second threshold value.

It should be pointed out once again that other evaluation methods can of course also be used for the comparison results within the scope of the present disclosure, which is applicable also in the case of the above-described calculation of percentages, a weighting of comparison results can be performed. In this case, the weighting does not or does not only have to be dependent on a degree of agreement in the comparison result but can also be chosen as a function of properties of the examination evolution, for example the number of examined time points.

In an advantageous development of the present disclosure it is provided that, in order to determine a candidate group of time points at which the measurement was possibly disrupted, the comparison evolution exhibiting the greatest agreement is compared time point by time point with the signal evolution, and time points at which the measured magnetic resonance signal of the signal evolution deviates by more than one limit value from the comparison value of the comparison evolution are marked as belonging to the candidate group. Advantageously, therefore, it is possible according to the disclosure, generally speaking, to carry out an identification of time points that are subject to interference. The expected comparison evolution that occurred most frequently is compared with the actual measured signal evolution. All points that deviate strongly, for example by more than one limit value (e.g. 10 to 20%, preferably 10%), from the expected comparison value can initially be assumed as subject to interference and be assigned to a candidate group. With regard to said candidate group, a benefit can now be derived therefrom in different ways.

Firstly, a preferred embodiment provides that, in the case of at least one, preferably more than one, subsequently processed pixel, a check is carried out for each time point of the candidate group to establish whether a deviation exceeding the limit value is also present in said pixel, a time point remaining in the candidate group only if the percentage of pixels for which the deviation exceeds the limit value exceeds a predetermined magnitude. Advantageously, the candidate group is matched with the comparison results of at least one, preferably more than one, other pixel, a check being carried out to establish whether the same time points are identified as subject to interference there. In this way, individual outliers in the magnetic resonance images can be distinguished per se from disturbances that are actually present generally with respect to time. For example, if the information relating to the candidate group is to be used as early as possible during the overall evaluation process, 5 to 15 pixels can be examined in this manner. It is also possible in another variant, however, to analyze all pixels of the magnetic resonance images in this manner to determine the candidate group.

Preferably, the candidate group of at least one, e.g. first pixel can be taken into account in the comparison process for at least one further pixel by omitting time points of the candidate group and/or by lower weighting of comparison results comprising time points of the candidate group. In this case it is preferred, as already mentioned, to make reference to more than one such first pixel, for example 5 to 15 pixels, in order to permit a more robust determination of the candidate group. The candidate group can then be assumed as a basis for the calculation of further pixels, with the result that the described examination of the examination evolutions can be performed there either in a reduced form or only for the signal evolution without the disrupted time points. It should be noted that an embodiment is of course also conceivable in which a repeat evaluation taking the candidate group into account is carried out for the pixels on the basis of which the candidate group was determined, in order to verify the obtained result.

It should further be noted at this point that it is of course also possible to take action in the case of unduly large candidate groups that would exclude too great a percentage of time points, for example to output this information to a user, to perform a dynamic adjustment of the limit value, or the like.

It should further be pointed at this juncture that the method proposed herein can of course also be used with magnetic resonance devices that are located inside a shielded cabin. In that event, however, the method does not have to be in an activated state at all times, but for example can be selectable by a user and/or run continuously or on a sample basis in the background to identify other possible sources of radiofrequency interference, for example due to crosstalk.

A development of the present disclosure can provide measurement data of at least one sensor, such as a pick-up antenna, measuring disruptive effects on the magnetic resonance measurement is already evaluated prior to the comparison evolutions to exclude the magnetic resonance signals of certain time points. Although it is an advantage of the present disclosure to get by without additional hardware such as pick-up antennas, except for very severe interferences, such hardware in the form of sensors, which for example measure interference fields, if already present can be used in a further aspect of the disclosure as a basis for the identification of disrupted time points so that all time points at which the measurement data of the at least one sensor has detected relevant interference effects, in particular radiofrequency signals, acting from outside can be separated out in the evaluation.

A beneficial development of the present disclosure further provides that at least one result of a comparison by singular value decomposition is used in addition in the determination of the comparison evolution exhibiting the greatest agreement. This means that, for example, the approach mentioned in the article by Debra F. McGivney et al. cited in the introduction can also be used in a supplementary or supporting manner within the scope of the present disclosure to increase the robustness further.

As well as the method, the present disclosure also relates to a magnetic resonance device comprising a control device configured to perform the method according to the disclosure. Thus, all statements made with respect to the method according to the disclosure can be applied analogously to the magnetic resonance device according to the disclosure, by means of which the already cited advantages can therefore likewise be obtained.

The control device, which may comprise at least one processor and/or at least one storage means, can for example include, in addition to a conventional sequence unit which controls the acquisition operation of the magnetic resonance device, one or more hardware processors and/or other suitable circuitry configured to perform the following functions. For instance, the hardware processors may include and/or form part of a definition unit for defining the at least two examination evolutions. Furthermore, the hardware processors may include and/or form part of a matching unit that performs the matching with the database, in particular also forming part of the control device, for the different pixels with regard to the examination evolutions defined by the definition unit. The hardware processors may include and/or form part of a merging unit that delivers the comparison evolution exhibiting the best agreement for a corresponding pixel and thus yields an n-tuple of result values, in particular material parameters, as the result of the quantitative magnetic resonance imaging, in this instance, in practice, of the magnetic resonance fingerprinting. In order to perform further steps in embodiments of the disclosure, the control device may also include further functional units and/or suitable components, for example an identification unit for identifying disrupted time points in a candidate group.

A computer program according to the disclosure can include a non-transitory computer-readable medium of any suitable type, which may store computer-readable instructions readable by one or more hardware processors (e.g., the various control device components discussed above and elsewhere herein) to execute the methods and/or other aspects of the embodiments as further discussed throughout the disclosure. For instance, the computer program may be loaded directly into a memory of a control device of a magnetic resonance device and has a program means for performing the steps of a method according to the disclosure when the computer program is executed in the control device of the magnetic resonance device.

The computer program can be stored on an electronically readable data medium according to the disclosure, which therefore comprises electronically readable control information stored thereon which comprises at least one cited computer program and is embodied in such a way that it performs a method according to the disclosure when the data medium is used in a control device of a magnetic resonance device. The data medium can be in particular a non-transitory data medium, for example a CD-ROM.

BRIEF DESCRIPTION OF THE DRAWINGS/FIGURES

The drawings explained herein are intended to provide a further understanding of the present disclosure and constitute part of the present disclosure. Exemplary embodiments of the present disclosure and descriptions thereof are intended to explain the present disclosure, instead of improperly limiting the present disclosure.

Further advantages and details of the present disclosure will become apparent from the exemplary embodiments described herein below, as well as with reference to the drawings, in which.

DETAILED DESCRIPTION

Figure 1:
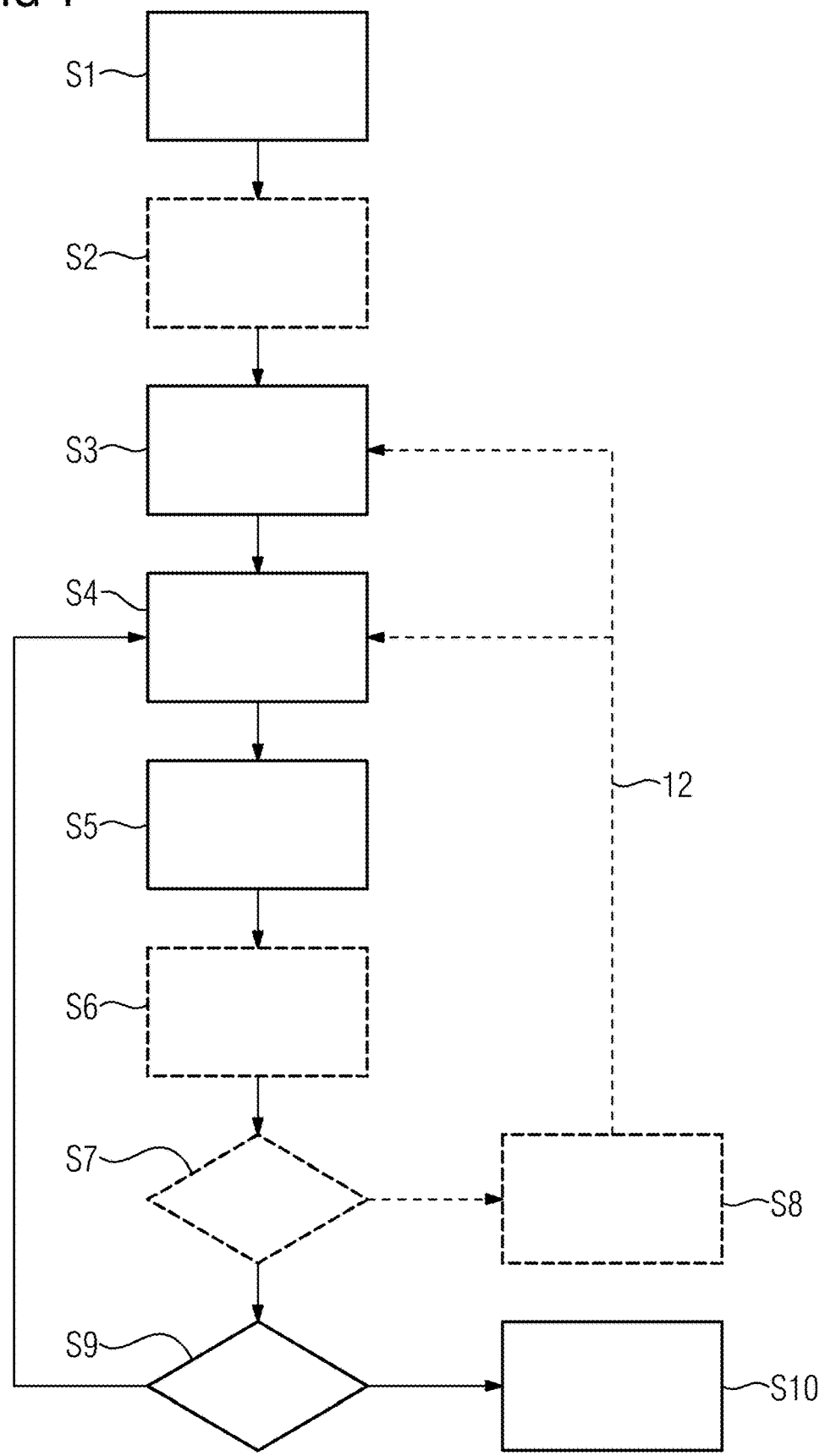
FIG. 1 shows a flowchart of an exemplary embodiment of the method, according to an embodiment of the present disclosure.

In order to more clearly understand the technical features, objectives, and effects of the present disclosure, the specific embodiments of the present disclosure are described with reference to the accompanying drawings, and in the drawings, the same number represents components of the same structure or of similar structures but the same function.

The word "exemplary" represents "serving as an instance, example or description" herein, and any illustration and embodiment described as "exemplary" herein should not be interpreted as a more preferred or more advantageous technical solution.

FIG. 1 shows a flowchart of an exemplary embodiment of the method, according to an embodiment of the present disclosure. The aim here is to implement a magnetic resonance fingerprinting method that is maximally robust to interference, since in the present instance use is made of a magnetic resonance device without a shielded cabin. This means that if, in step S1, a time series of magnetic resonance images of an examination region of a patient is acquired, each magnetic resonance image being measured at a time point assigned to the latter, interference effects can occur, in particular radiofrequency disturbance caused by interference signals from outside the magnetic resonance device. These interference effects are ultimately neither predictable nor controllable in terms of the time of their occurrence or in their impact.

In an optional step S2, it is conceivable to use additional, likewise optional hardware on the magnetic resonance device, such as sensors that measure the interference fields, for example pick-up coils, to exclude magnetic resonance images of specific time points from the further evaluation from the outset on account of interference; ultimately, however, this is not necessary when the method according to the disclosure is used, since this itself produces a robustness toward sporadically present forms of interference.

To that end, in step S3, multiple examination evolutions are derived from each signal evolution of each pixel of the magnetic resonance images, i.e. an evolution including all magnetic resonance signals for all time points, i.e. all magnetic resonance images, which multiple examination evolutions are to be used as a basis for the matching with a database in which comparison evolutions are stored. The signal evolution itself is chosen here as one of the examination evolutions; the other examination evolutions correspond to partial evolutions in which consequently magnetic resonance signals are not used for all time points at which a magnetic resonance image is present, but only for some of said time points.

Figure 2:
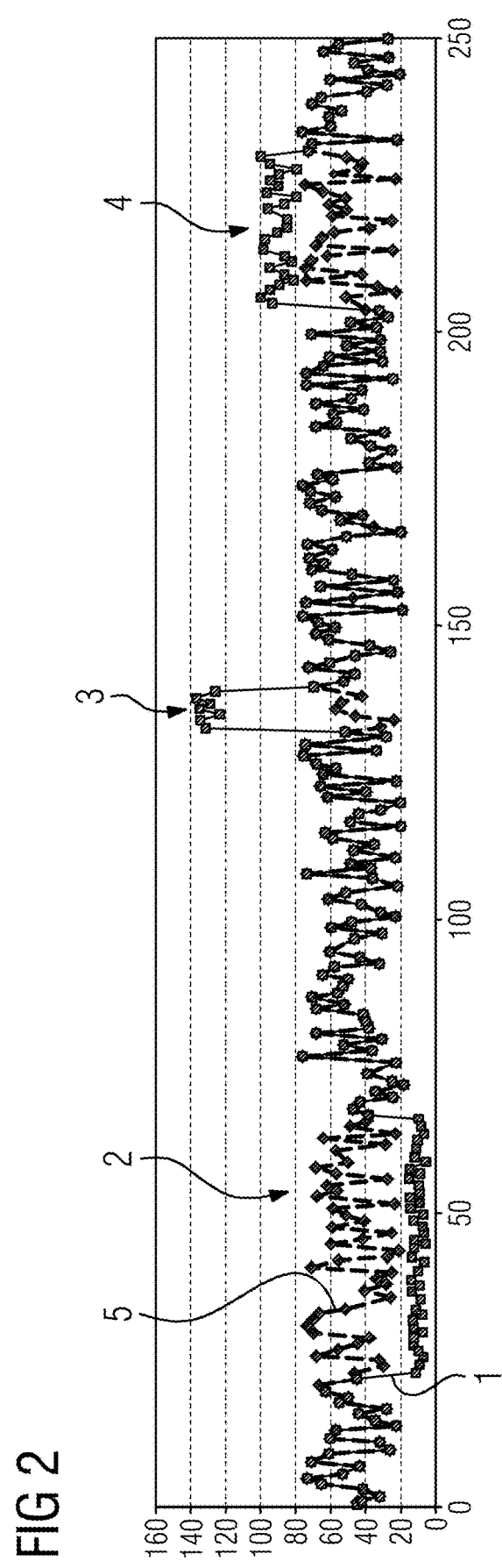
FIG. 2 shows an exemplary disrupted signal evolution in comparison with a non-disrupted signal evolution, according to an embodiment of the present disclosure.

Referring now to FIG. 2, which shows a signal evolution, i.e. magnetic resonance fingerprint, in the form of the curve 1 (continuous), is in this example subject to interference in three time ranges 2, 3 and 4. This fingerprint has been derived for a pixel from in this case 250 magnetic resonance images, meaning that 250 time points also exist at which measurements were taken. The corresponding magnetic resonance signals are indicated by the points marked with squares. For comparison, the dashed curve 5 connected by points marked by diamonds shows a theoretically determined, undisrupted signal evolution which can also be present as a comparison evolution in the database. As can be seen, interference effects, caused for example by the absence of a shielded cabin, result in a decrease in the magnetic resonance signal in the time range 2, and result in an increase in the signal in the time ranges 3 and 4. Clearly, the interferences can also last for different lengths of time. If no sensors are installed, as is to be assumed initially in the following, these interferences are furthermore unknown.

The idea of the present disclosure is now also to consider partial evolutions, e.g. in addition to the signal evolution, and to individually match these with the database since this increases the probability of making reference also to largely undisrupted regions and therefore of being more robust toward such interference effects.

Figure 3:
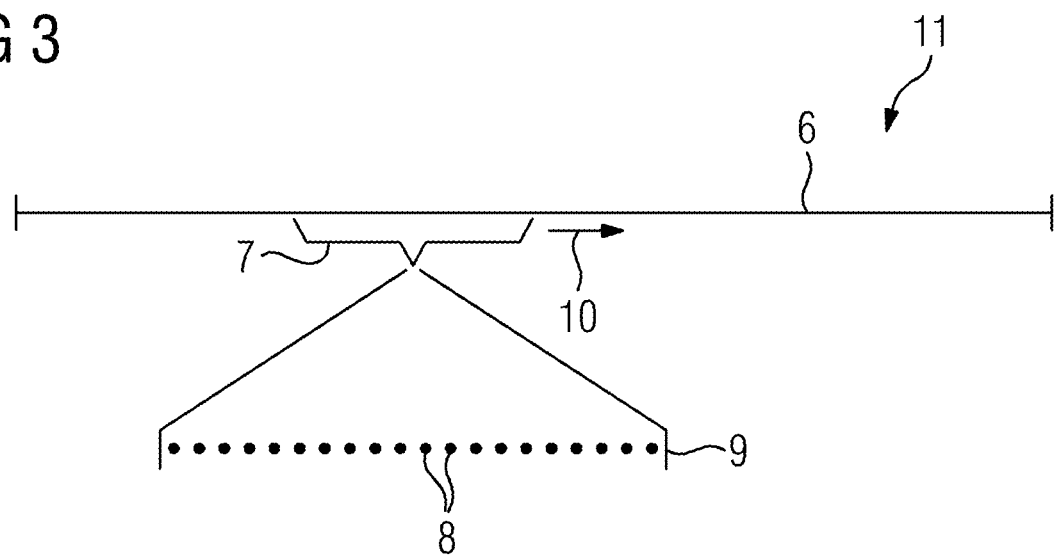
FIG. 3 shows a possible means of defining examination evolutions by means of a moving window, according to an embodiment of the present disclosure.

Referring now to FIG. 3, an example is shown for defining such partial evolutions as examination evolutions. Herein, there is shown in schematic form firstly the overall acquisition time period 6, in which magnetic resonance images have been recorded and which therefore comprises the 250 acquisition time points. Also defined is a window 7, via which, in the present case, 20 consecutive time points 8 can be selected as a partial evolution 9 from the overall evolution (signal evolution). As the arrow 10 indicates, the window 7 can be a moving window for defining a plurality of partial evolutions 9, the window 7 being shifted by a fixed amount to define different partial evolutions 9 and, in this way, producing a maximally uniform coverage of the time period 6, which symbolizes the entire signal evolution 11. In addition to the variant depicted in FIG. 3, it is also provided in this exemplary embodiment to choose, in several partial evolutions, time points 8 spaced apart by a specific (e.g. predetermined or fixed) or random number, for example 5, of time points 8 or by groups of successive time points 8.

Referring now back to FIG. 1, in a step S4, the examination evolutions defined in step S3 are now used to match each individual one of these examination evolutions against a database with comparison evolutions. In this process, reference evolutions are of course derived from the comparison evolutions based on the knowledge of the different time points, said reference evolutions containing the same time points as the corresponding examination evolution that is to be matched. To achieve the actual matching, comparison algorithms (e.g. those already generally known) can be called upon, for example pattern recognition algorithms and/or such that correlations between the examination evolution and various reference evolutions of the database are otherwise calculated. In any case, the result is a comparison result by means of which at least the reference evolution exhibiting the best agreement with the examination evolution, and therefore comparison evolution, is described.

In a step S5, the comparison results are then merged in order to be able to determine a comparison evolution that exhibits the greatest agreement overall. However, it may also be a result here that no meaningful determination of such an end result is possible, whereupon this situation is output to a user. A new measurement can then be performed, for example.

In reality, the exemplary embodiment described herein provides, in the event that all of the comparison results are consistent in terms of the best agreement, an assumption of an undisrupted measurement, establishment of the comparison evolution indicated by the comparison results, and exhibiting the best agreement in each case as the end result.

If, however, only a maximum percentage of the comparison results undershooting a first threshold value indicates the same comparison evolution as that exhibiting the best agreement with the examination evolution, 25% having being chosen as the first threshold value in the present example, an extremely severe interference can be assumed, which makes a reliable determination of a comparison evolution exhibiting the best agreement overall impossible, with the result that this state of affairs can be output to a user, as already explained above.

If the maximum percentage of identical comparison results exceeds the first threshold value, i.e. is above 25% in the present example, the corresponding comparison evolution is defined as the end result. However, a second threshold value is also defined in the present example, in the present instance 50%, in which case, for maximum percentages of identical comparison results lying between 25 and 50%, information is additionally output to a user to the effect that certain uncertainties due to interferences exist. This warning is no longer output if a maximum percentage exceeds the second threshold value, i.e. is above 50%.

In an optional step S6, the comparison evolution exhibiting the best agreement and determined as the end result in step S5 can now be used to identify time points at which interferences could be present. For this purpose, the comparison evolution is compared time point by time point with the signal evolution. Magnetic resonance signals that deviate by more than a limit value from the comparison evolution, for example by more than 10%, point to an interference, with the result that the corresponding time point is added to a candidate group.

In a likewise optional step S7, a check is carried out to establish whether the examination of step S6 has been performed for a sufficiently large number of firstly evaluated pixels, for example 5 to 15 pixels. If this is the case, a check is carried out in a step S8, also associated with this optional procedure, to establish whether the time points contained in the candidate group have been acquired for a sufficiently large number of pixels, for example for at least 80% of the considered pixels. Only then is the time point retained in the candidate group.

Following on from step S8, the candidate group can be used in different ways, as indicated by the arrow 12. Thus, for example, a redefinition of examination evolutions with omission of time points marked by the candidate group can be performed in step S3. It is also conceivable to perform weightings of the comparison results and/or even of specific time points as a function of the candidate group in steps S4 and S5.

If the optional steps S6, S7, and S8 are used, following the consideration of the (in the example) 5 to 15 pixels, steps S6 and S7 can be omitted for the further pixels. It is of course also possible to identify interferences for the further pixels also and to refine the candidate group further. In particular, embodiments are also conceivable in which the identification in step S6 is performed for all pixels, and then a candidate group for all pixels is determined and a new determination is carried out taking the time points of the candidate group into account.

In a step S9, a check is carried out to establish whether all pixels have been processed, whereupon, if this is the case, the results can be output to a user in a step S10.

In this case, the comparison evolutions are each assigned n-tuples of quantitative material parameters as result values, for example comprising relaxation times and/or other properties that can be measured by the magnetic resonance. Thus, material parameters are assigned to each pixel, such that it is therefore possible, by combining all of the pixels, to produce quantitative material parameter maps and output these in step S10, as is generally known.

Figure 4:
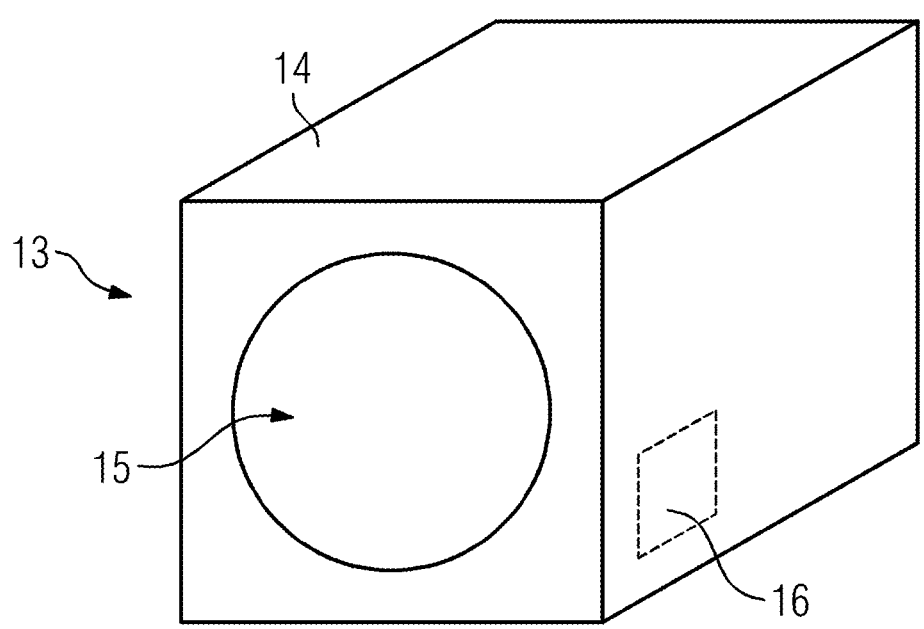
FIG. 4 shows a magnetic resonance device, according to an embodiment of the present disclosure.

FIG. 4 shows a schematic diagram of a magnetic resonance device 13 according to the disclosure. This comprises a main magnet unit 14 in which a patient receiving zone 15 is defined. A radiofrequency coil array and a gradient coil array can be provided surrounding the patient receiving zone 15; a patient to be examined can be introduced into the patient receiving zone 15 by means of a patient couch (not shown in further detail here). The operation of the magnetic resonance device 13 is controlled by a control device 16 which is embodied to carry out the method according to the disclosure and the configuration of which is explained in more detail by FIG. 5.

Figure 5:
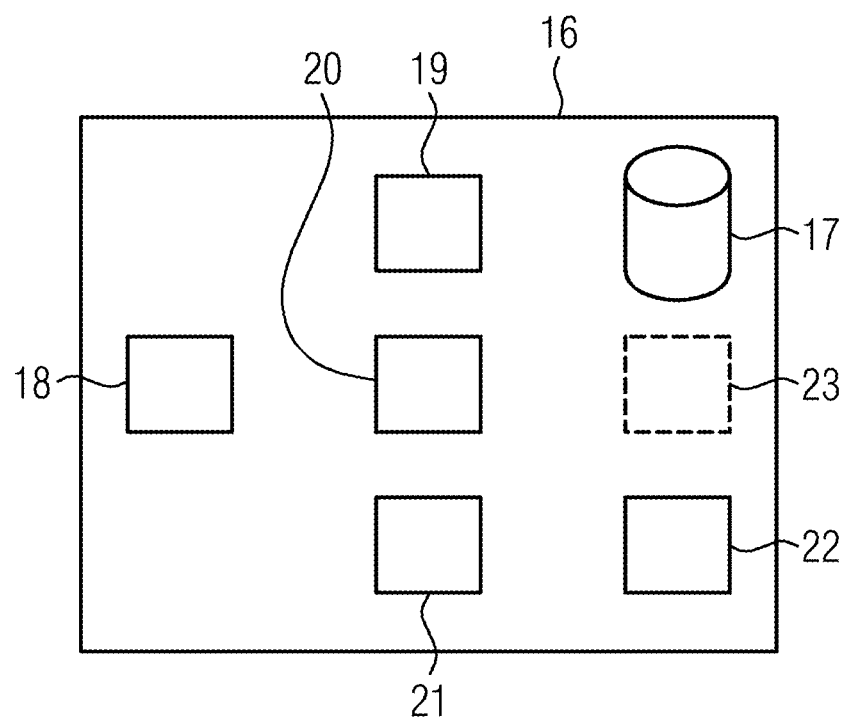
FIG. 5 shows the functional configuration of the control device of the magnetic resonance device, according to an embodiment of the present disclosure.

According to FIG. 5, the database 17 containing the comparison evolutions for the matching process is stored in and/or otherwise accessible by the control device 16. The control device 16 further comprises a sequence unit 18 for controlling the acquisition operation and also for acquiring the magnetic resonance images by means of defined magnetic resonance sequences at the respective time points. In this case, the acquisition sequence of the magnetic resonance images, as well as the correspondingly used acquisition parameters, correspond to those that were also used for deriving the comparison evolutions of the database 17.

In order to be able to evaluate magnetic resonance images acquired for quantitative magnetic resonance imaging, in this case magnetic resonance fingerprinting, in accordance with the method shown in FIG. 1, the control device 16 further comprises a definition unit 19 for performing step S3, such that the examination evolutions to be matched accordingly with the database 17 are defined by means of the definition unit 19.

The matching with the database 17 for each pixel and each examination evolution is then performed by a matching unit 20. The comparison results determined by the matching unit 20 are then, as described, forwarded to a merging unit 21, where an end result is determined on the basis of the cited criteria, i.e. a comparison evolution exhibiting the best agreement overall for said pixel. The end results, but also other cited information, for example also the non-determinability of comparison evolutions exhibiting the best agreement, can be output to a user via an output unit 22 (e.g. a display).

If the preferred but optional steps S6, S7 and S8 are provided, the control device 16 can further include an identification unit 23 by means of which, as described, time points at which an interference may have been present are identified and stored as a member of the candidate group and used further in an appropriate manner.

As noted above, the described method may be present, for instance, in the form of a computer program that implements the method on the control device 16 when the program is executed in the control device 16. In principle, however, it is also conceivable to implement parts of the method according to the disclosure by means of software components or hardware components exclusively or in combination with one another. The computer program can be stored on an electronically readable data medium (not shown) containing electronically readable control information which comprises at least the computer program and is embodied in such a way that it performs a method as described when the data medium is used in the control device 16 of the magnetic resonance device 13.

Although the disclosure has been illustrated and described in greater detail on the basis of the preferred exemplary embodiment, the disclosure is not limited by the disclosed examples and other variations may be derived herefrom by the person skilled in the art without leaving the scope of protection of the disclosure.

What is claimed is:

1. A method for quantitative magnetic resonance imaging, comprising:
- acquiring, via a magnetic resonance device, a time series of magnetic resonance images representing magnetic resonance data for an examination region, the time series of magnetic resonance images being at least partially affected by radiofrequency interference caused by interference signals external to the magnetic resonance device as a result of the magnetic resonance device not being arranged in a shielded cabin,
- wherein each magnetic resonance image from among the magnetic resonance images within the time series being measured at a different respective time point following an excitation;
- determining, for each pixel of the magnetic resonance data that is associated with each respective one of the magnetic resonance images, a signal evolution varying with respect to time;
- comparing, for each pixel of the magnetic resonance data that is associated with each respective one of the magnetic resonance images, the respective signal evolution with comparison evolutions stored in a database,
- wherein the comparison process is performed by:
  - defining, for the signal evolution associated with each respective pixel, at least a first and a second examination evolution, the first examination evolution corresponding to a full signal evolution that encompasses an entirety of the magnetic resonance images within the time series, and the second examination evolution corresponding to a partial evolution that encompasses less than the entirety of the magnetic resonance images;
  - comparing the at least first and second examination evolution with reference evolutions formed from common time points of respective comparison evolutions to obtain comparison results, the comparison evolutions stored in the database representing a theoretically determined, undisrupted signal evolution not being affected by radiofrequency interference and having time points corresponding to the full signal evolution identified with the first examination evolution; and
  - determining, using the comparison results, a comparison evolution exhibiting a greatest agreement between the at least first and second examination evolution and the respective reference evolutions; and
- assigning, to each respective pixel that is associated with each respective one of the magnetic resonance images, at least one quantitative result value on which the comparison evolution is based.

2. The method as claimed in claim 1, wherein the second examination evolution is from among a plurality of defined partial evolutions that together encompass the entirety of the magnetic resonance images within the time series.

3. The method as claimed in claim 1, wherein the second examination evolution is defined using a window selecting a predetermined number of sequential time points.

4. The method as claimed in claim 3, wherein the window includes a range between 20 to 50 time points.

5. The method as claimed in claim 3, wherein the second examination evolution is from among a plurality of a disjointed sequence of partial evolutions defined by shifting the window.

6. The method as claimed in claim 1, wherein the second examination evolution is defined using time points that are (i) spaced apart from one another by a predetermined number, the predetermined number being between 4 to 10 time points, or (ii) by groups of sequential time points, with each respective one of the groups of sequential time points comprising between 2 to 8 time points.

7. The method as claimed in claim 1, wherein the second examination evolution is defined using time points that are (i) spaced apart from one another by a random number, the random number being from 4 to 10 time points, or (ii) by groups of sequential time points, with each respective one of the groups of sequential time points comprising between 2 to 8 time points.

8. The method as claimed in claim 1, wherein the act of determining the comparison evolution exhibiting the greatest agreement comprises:
- when consistent comparison results are identified from among the comparison results indicating an agreement in excess of a first threshold value, the corresponding comparison evolution indicated by the comparison results is determined as the comparison evolution exhibiting the greatest agreement,
- when a first predetermined percentage of the comparison results from among the comparison results are identified as undershooting the first threshold value that is indicative of the same comparison evolution as that exhibiting the best agreement of all of the comparison results, a non-determinability of a comparison evolution exhibiting the greatest agreement is output, and
- when a percentage of the comparison results from among the comparison results are identified as exceeding the first threshold value that is indicative of the same comparison evolution as that exhibiting the best agreement of all of the comparison results, the most-indicated comparison evolution is determined as the comparison evolution exhibiting the greatest agreement.

9. The method as claimed in claim 8,
- wherein, when a second predetermined percentage of the comparison results from among the greatest number of comparison results are identified exceeding the first threshold value that is indicative of the same comparison evolution as that exhibiting the best agreement out of all comparison results, if a second, higher threshold value is undershot by the second predetermined percentage, information indicating a lower level of reliability is generated and output.

10. The method as claimed in claim 1,
- wherein, to determine a candidate group of time points for which a measurement was potentially subjected to interference, the comparison evolution for each pixel exhibiting the greatest agreement is compared time point by time point with the signal evolution for each respective pixel, and time points at which the measured magnetic resonance signal of the signal evolution deviates by more than one limit value from the comparison value of the comparison evolution are marked as belonging to the candidate group of time points at which the measurement was potentially subjected to interference.

11. The method as claimed in claim 10,
wherein the candidate group of at least one pixel is taken into account in the comparison process for at least one further pixel by omitting time points of the candidate group and/or by performing a lower weighting of comparison results comprising time points of the candidate group.

12. The method as claimed in claim 10,
performing a check for at least one subsequently-processed pixel at each time point within the candidate group to establish whether a deviation exceeding the limit value is also present in the at least one subsequently-processed pixel, wherein a time point remains in the candidate group only when a percentage of pixels for which the deviation exceeds the limit value exceeds a predetermined magnitude.

13. The method as claimed in claim 8, wherein measurement data of at least one sensor that includes a pick-up antenna that is configured to measure disruptive effects on the magnetic resonance measurement is evaluated prior to the comparison evolutions to exclude the magnetic resonance signals of certain time points.

14. A magnetic resonance device, comprising:
a main magnet unit including a patient receiving zone;
a radiofrequency coil array and a gradient coil array surrounding the patient receiving zone; and
a control device configured to:
acquire a time series of magnetic resonance images representing magnetic resonance data for an examination region associated with the patient receiving zone, the time series of magnetic resonance images being at least partially affected by radiofrequency interference caused by interference signals external to the magnetic resonance device as a result of the magnetic resonance device not being arranged in a shielded cabin,
wherein each magnetic resonance image from among the magnetic resonance images within the time series being measured at a different respective time point following an excitation;
determine, for each pixel of the magnetic resonance data that is associated with each respective one of the magnetic resonance images, a signal evolution varying with respect to time;
compare, for each pixel of the magnetic resonance data that is associated with each respective one of the magnetic resonance images, the respective signal evolution with comparison evolutions stored in a database,
wherein the comparing process is performed by:
defining, for the signal evolution associated with each respective pixel, at least a first and a second examination evolution, the first examination evolution corresponding to a full signal evolution that encompasses an entirety of the magnetic resonance images within the time series, and the second examination evolution corresponding to a partial evolution that encompasses less than the entirety of the magnetic resonance images;
comparing the at least first and second examination evolution with reference evolutions formed from common time points of respective comparison evolutions to obtain comparison results, the comparison evolutions stored in the database representing a theoretically determined, undisrupted signal evolution not being affected by radiofrequency interference and having time points corresponding to the full signal evolution identified with the first examination evolution; and
determining, using the comparison results, a comparison evolution exhibiting a greatest agreement between the at least first and second examination evolution and the respective reference evolutions; and
assign, to each respective pixel that is associated with each respective one of the magnetic resonance images, at least one quantitative result value on which the comparison evolution is based.

15. A non-transitory computer-readable medium associated with a magnetic resonance device, the computer-readable medium having instructions stored thereon that, when executed by one or more processors of the magnetic resonance device, cause the magnetic renounce device to:
acquire a time series of magnetic resonance images representing magnetic resonance data for an examination region, the time series of magnetic resonance images being at least partially affected by radiofrequency interference caused by interference signals external to the magnetic resonance device as a result of the magnetic resonance device not being arranged in a shielded cabin,
wherein each magnetic resonance image from among the magnetic resonance images within the time series being measured at a different respective time point following an excitation;
determine, for each pixel of the magnetic resonance data that is associated with each respective one of the magnetic resonance images, a signal evolution varying with respect to time;
compare, for each pixel of the magnetic resonance data that is associated with each respective one of the magnetic resonance images, the respective signal evolution with comparison evolutions stored in a database,
wherein the comparing process is performed by:
defining, for the signal evolution associated with each respective pixel, at least a first and a second examination evolution, the first examination evolution corresponding to a full signal evolution that encompasses an entirety of the magnetic resonance images within the time series, and the second examination evolution corresponding to a partial evolution that encompasses less than the entirety of the magnetic resonance images;
comparing the at least first and second examination evolution with reference evolutions formed from common time points of respective comparison evolutions to obtain comparison results, the comparison evolutions stored in the database representing a theoretically determined, undisrupted signal evolution not being affected by radiofrequency interference and having time points corresponding to the full signal evolution identified with the first examination evolution; and
determining, using the comparison results, the comparison evolution exhibiting a greatest agreement between the at least first and second examination evolution and the respective reference evolutions; and assigning, to each respective pixel that is associated with each respective one of the magnetic resonance images, at least one quantitative result value on which the comparison evolution is based.

\* \* \* \* \*